United States Patent
Xu et al.

(10) Patent No.: US 10,684,653 B2
(45) Date of Patent: Jun. 16, 2020

(54) FLEXIBLE DISPLAY DEVICE

(71) Applicants: Beijing BOE Optoelectronics Technology Co., Ltd., Beijing (CN); BOE Technology Group Co., Ltd., Beijing (CN)

(72) Inventors: Shaopeng Xu, Beijing (CN); Hao Wu, Beijing (CN); Xuzhong Liu, Beijing (CN); Na An, Beijing (CN); Zongwei Luo, Beijing (CN); Xiao Ma, Beijing (CN); Gang Ci, Beijing (CN); Baolei Guo, Beijing (CN); Xinfeng Gong, Beijing (CN); Bin Xu, Beijing (CN); Zhenhua Luo, Beijing (CN); Qingzhu Guan, Beijing (CN); Zheng Zhang, Beijing (CN); Wei Su, Beijing (CN); Guochun Wang, Beijing (CN); Zuoxin Yu, Beijing (CN); Jinzhao Zhou, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/169,707

(22) Filed: Oct. 24, 2018

(65) Prior Publication Data
US 2019/0297736 A1 Sep. 26, 2019

(30) Foreign Application Priority Data
Mar. 26, 2018 (CN) .......................... 2018 1 0253384

(51) Int. Cl.
*H05K 5/00* (2006.01)
*H05K 1/02* (2006.01)
(Continued)

(52) U.S. Cl.
CPC .......... *G06F 1/1652* (2013.01); *H05K 1/028* (2013.01); *H05K 5/0017* (2013.01);
(Continued)

(58) Field of Classification Search
CPC .... H05K 5/0017; H05K 1/028; H05K 5/0217; G06F 1/1652
See application file for complete search history.

(56) References Cited

U.S. PATENT DOCUMENTS

| 9,710,021 B2 * | 7/2017 | Kauhaniemi | G06F 1/1652 |
| 2006/0176243 A1 * | 8/2006 | Yeh | G06F 1/1624 |
| | | | 345/30 |

(Continued)

*Primary Examiner* — Daniel P Wicklund
*Assistant Examiner* — Christopher L Augustin
(74) *Attorney, Agent, or Firm* — McDermott Will & Emery LLP

(57) ABSTRACT

A flexible display device includes a flexible screen; a casing including a receiving portion and a support base; and a support member between the flexible screen and the casing, the support member including a rigid support portion and a flexible support portion which are arranged in a lengthwise direction of the flexible screen. The receiving portion includes a receiving chamber configured for receiving at least a part of the flexible screen and at least a part of the flexible support portion, and the flexible screen fits slidably with the support base by means of the support member.

19 Claims, 12 Drawing Sheets

(51) Int. Cl.
  *H05K 5/02* (2006.01)
  *H01L 27/32* (2006.01)
  *H01L 51/00* (2006.01)
  *G06F 1/16* (2006.01)

(52) U.S. Cl.
  CPC ............ *H05K 5/0217* (2013.01); *H01L 27/32* (2013.01); *H01L 51/0097* (2013.01); *H05K 2201/051* (2013.01); *H05K 2201/10128* (2013.01)

(56) References Cited

U.S. PATENT DOCUMENTS

| | | | | |
|---|---|---|---|---|
| 2008/0158795 A1* | 7/2008 | Aoki | ...................... | G06F 1/1616 361/679.27 |
| 2009/0051830 A1* | 2/2009 | Matsushita | ....... | G02F 1/133305 348/836 |
| 2011/0057895 A1* | 3/2011 | Tseng | ................... | G06F 1/1647 345/173 |
| 2012/0314400 A1* | 12/2012 | Bohn | ..................... | G09F 9/301 362/97.1 |
| 2013/0058063 A1* | 3/2013 | O'Brien | ................ | G06F 1/1624 361/807 |
| 2014/0099479 A1* | 4/2014 | Krall | ........................ | B32B 3/14 428/174 |
| 2014/0194165 A1* | 7/2014 | Hwang | ................. | G06F 1/1677 455/566 |
| 2014/0380186 A1* | 12/2014 | Kim | ..................... | G09G 3/2092 715/746 |
| 2016/0100478 A1* | 4/2016 | Lee | ...................... | H04M 1/0202 361/749 |
| 2016/0140888 A1* | 5/2016 | Lee | .......................... | G09G 3/20 345/698 |
| 2016/0202781 A1* | 7/2016 | Kim | ...................... | G06F 1/1652 345/173 |
| 2016/0231843 A1* | 8/2016 | Kim | ...................... | G06F 3/0412 |
| 2016/0366772 A1* | 12/2016 | Choi | .................... | G06F 1/1616 |
| 2016/0379589 A1* | 12/2016 | Longo | ................... | H05K 5/0221 345/520 |
| 2017/0168769 A1* | 6/2017 | Jeon | ..................... | G06F 3/04817 |
| 2017/0278436 A1* | 9/2017 | Chu | ....................... | G09F 9/30 |
| 2017/0285688 A1* | 10/2017 | Sun | ........................ | G06F 3/041 |
| 2018/0284964 A1* | 10/2018 | Kang | .................... | G06F 3/0488 |

* cited by examiner

FLEXIBLE DISPLAY DEVICE

CROSS-REFERENCE TO RELATED APPLICATION

This application claims the benefit of Chinese Patent Application No. 201810253384.6 filed on Mar. 26, 2018 in the State Intellectual Property Office of China, the whole disclosure of which is incorporated herein by reference.

TECHNICAL FIELD

The present disclosure relates to the field of display technologies, and in particular, to a flexible display device.

BACKGROUND

Flexible screens such as organic light emitting diode (abbreviated as OLED) display screens have seen significant development in recent years. Compared with traditional screens, flexible screens have significant advantages, such as their thinner size and lower power consumption; moreover, the application scenes of the flexible screens become wider and wider due to their rollable and flexible features.

However, the flexible screens are easy to be rolled and have good flexibility, and are prone to be ridged or grooved, thereby causing a poor flatness, and even affecting the display effect adversely.

SUMMARY

In an aspect, it is provided a flexible display device including: a flexible screen; a casing including a receiving portion and a support base; and a support member between the flexible screen and the casing, the support member including a rigid support portion and a flexible support portion which are arranged in a lengthwise direction of the flexible screen, wherein the receiving portion includes a receiving chamber configured for receiving at least a part of the flexible screen and at least a part of the flexible support portion, and the flexible screen fits slidably with the support base by means of the support member.

Optionally, an orthographic projection of the rigid support portion on the support base at least partially overlaps with an orthographic projection of the flexible screen on the support base.

Optionally, the flexible display device further includes an elastic buffer layer between the flexible screen and the support member.

Optionally, the support base includes an accommodating slot, a first end of the accommodating slot communicates with an outlet of the receiving chamber, and the accommodating slot passes through the support base; and the flexible screen fits slidably with the accommodating slot at least by means of the flexible support portion.

Optionally, the accommodating slot includes a first slot portion and a second slot portion, the first slot portion having a first width in a widthwise direction of the flexible screen, the second slot portion having a second width in the widthwise direction of the flexible screen, the first width being larger than the second width; and the flexible support portion includes protrusions that protrude from the flexible screen and the rigid support portion in the widthwise direction of the flexible screen; and the flexible support portion fits slidably with the first slot portion.

Optionally, a first end of the first slot portion communicates with the outlet of the receiving chamber; a step is formed at a junction between a second end of the first slot portion and a first end of the second slot portion; and a second end of the second slot portion passes through the support base.

Optionally, a width of the rigid support portion in the widthwise direction of the flexible screen is smaller than a width of the flexible support portion in the widthwise direction of the flexible screen.

Optionally, the flexible support portion includes a plurality of pillow pieces arranged in the lengthwise direction of the flexible screen, each of the plurality of pillow pieces extending in a widthwise direction of the flexible screen.

Optionally, a cross section of each of the plurality of pillow pieces perpendicular to the widthwise direction of the flexible screen is in a shape of an inverted trapezoid.

Optionally, the plurality of pillow pieces of the flexible support portion include a tail pillow piece and a head pillow piece, the tail pillow piece being located at an end of the flexible support portion proximal to the receiving chamber, the head pillow piece being located at an end of the flexible support portion distal to the receiving chamber; and angles between adjacent side faces of the plurality of pillow pieces are increased from the head pillow piece towards the tail pillow piece.

Optionally, the flexible display device further includes a protective layer between the support member and the casing, the protective layer being connected to at least a bottom of the flexible support portion.

Optionally, the flexible display device further includes a protective layer between the support member and the casing, the protective layer being connected to at least a bottom of the flexible support portion.

Optionally, the protective layer includes a plurality of protective blocks arranged in the lengthwise direction of the flexible screen, each of the plurality of protective blocks extending in the widthwise direction of the flexible screen extend.

Optionally, a cross section of each of the plurality of protective blocks perpendicular to the widthwise direction of the flexible screen is in a shape of an inverted trapezoid.

Optionally, a material of the flexible support portion includes any one or a combination of metal, rigid plastic and hard composite.

Optionally, one side of the protective layer facing towards the support member is adhesive, and the other side of the protective layer facing away from the support member is elastic.

Optionally, the amount of the plurality of pillow pieces is the same as the amount of the plurality of protective blocks.

Optionally, the flexible display device further includes: a reel in the receiving chamber, at least one of the flexible screen and the support member being connected to the reel; and a locking member configured to limit rotation of the reel so as to position the flexible screen.

Optionally, the locking member includes a ratchet mechanism including a ratchet and a pawl, the ratchet being coaxially connected to the reel, the pawl engaging with the ratchet.

Optionally, the locking member further includes an unlocking switch and an elastic return member, the unlocking switch being connected to the pawl to trigger the pawl to disengage from the ratchet, the elastic return member being configured to drive the ratchet to rotate in one direction so as to retract the flexible screen into the receiving chamber.

BRIEF DESCRIPTION OF THE DRAWINGS

The aspects and advantages of the present disclosure will become apparent and readily understood from the description of the embodiments with reference to the accompanying drawings, wherein.

DETAILED DESCRIPTION OF EMBODIMENTS

Figure 1:
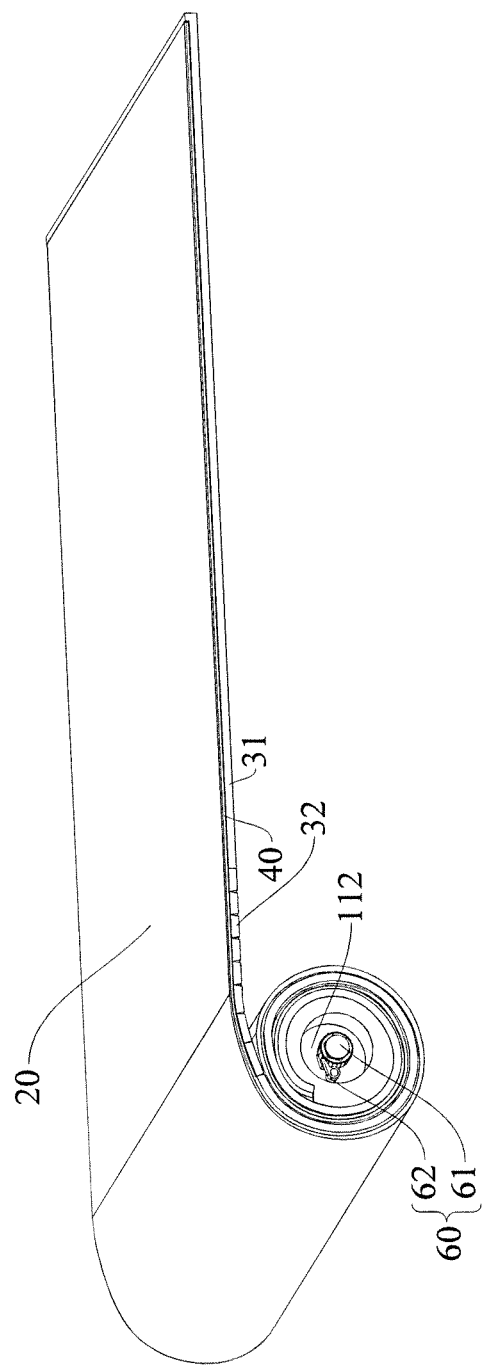
FIG. 1 is a perspective view of a flexible display device according to an embodiment of the present disclosure, in which a casing of the flexible display device is omitted.

Embodiments of the present disclosure are described in detail below, and examples of the embodiments are illustrated in the drawings, wherein the same or similar reference numerals are used to refer to the same or similar elements or elements having the same or similar functions. The embodiments described below with reference to the accompanying drawings are intended to be illustrative for the present disclosure, and are not to be construed as limiting the present disclosure.

Figure 2:
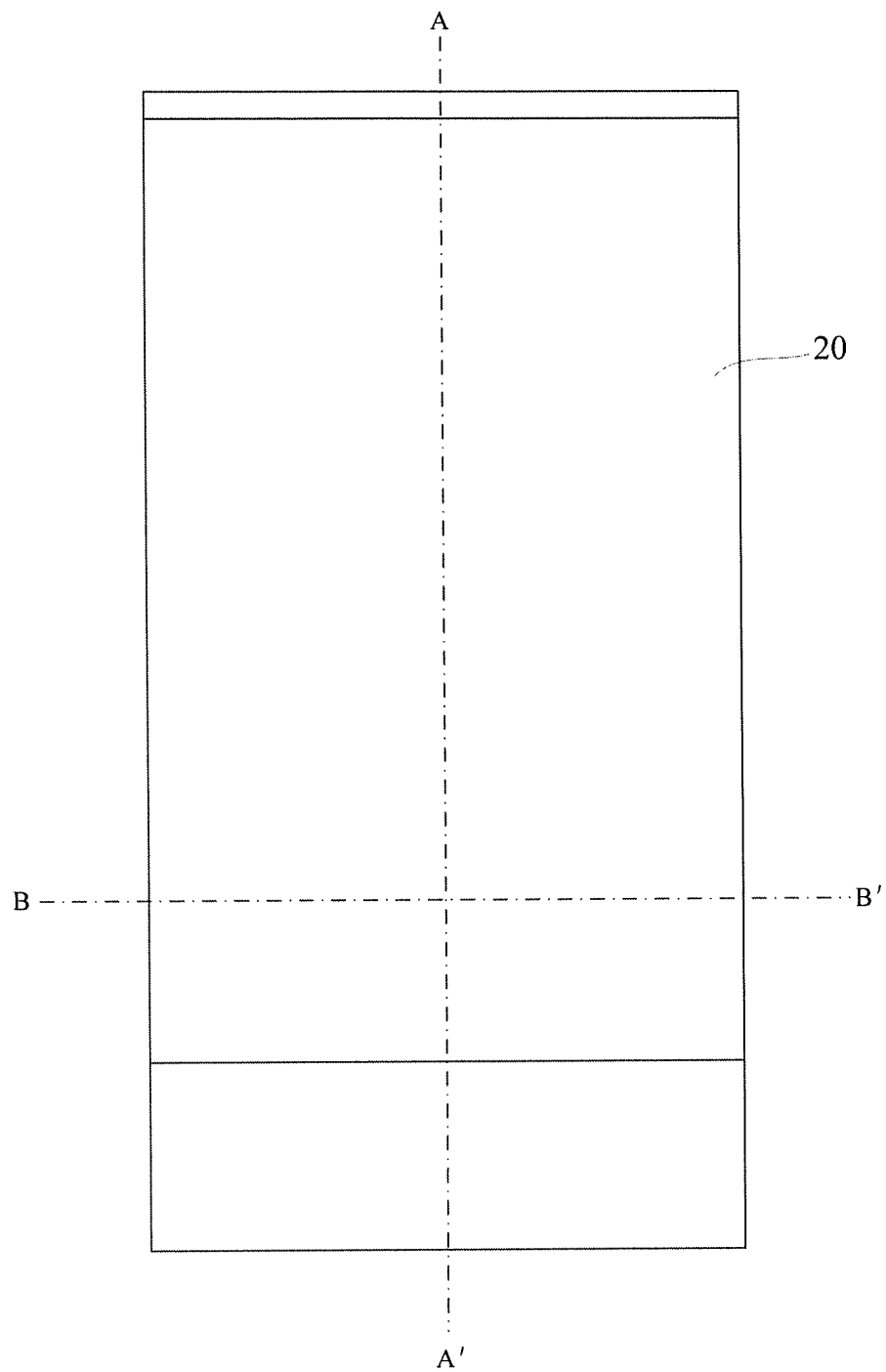
FIG. 2 is a plan view of a flexible display device according to an embodiment of the present disclosure, in which some components of the flexible display device are omitted in order to clearly illustrate the flexible screen.
Figure 3:
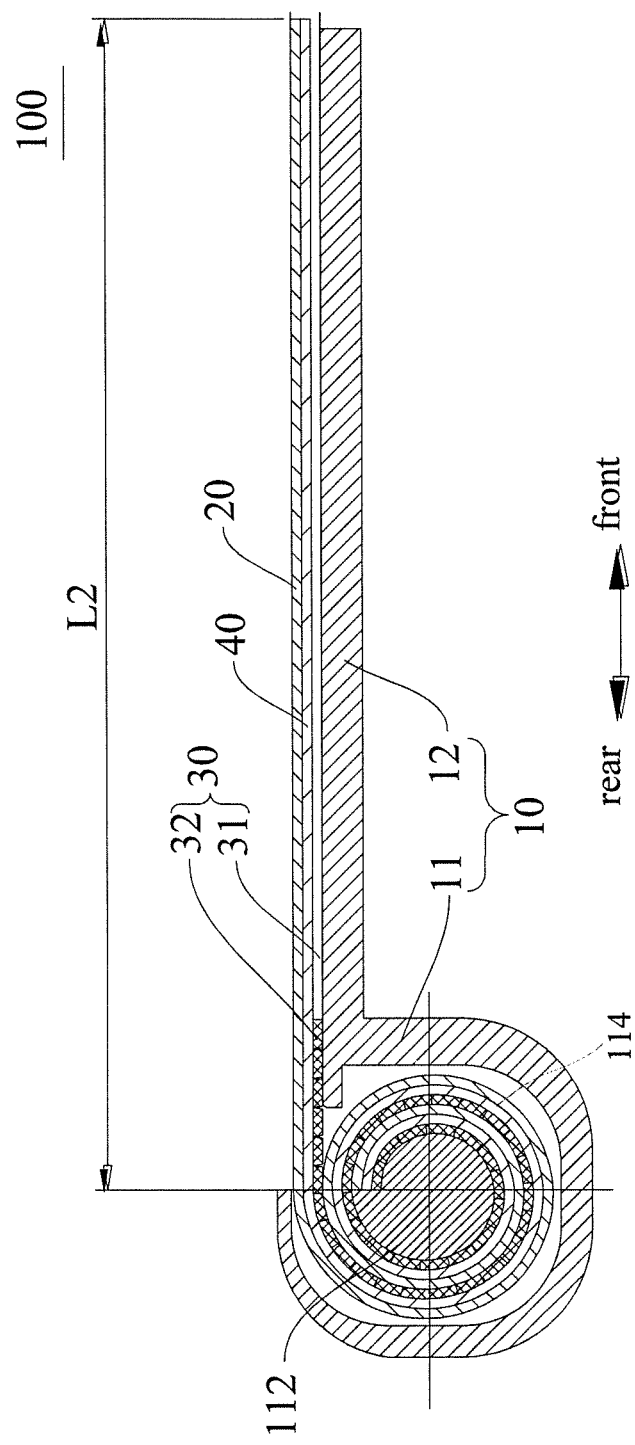
FIG. 3 is a cross-sectional view of the flexible display device according to an embodiment of the present disclosure taken along line AA' in FIG. 2, in which the flexible screen is at a minimum extendable position.

FIG. 1 is a perspective view of a flexible display device according to an embodiment of the present disclosure, FIG. 2 is a plan view of a flexible display device according to an embodiment of the present disclosure, and FIG. 3 is schematic cross-sectional view of the flexible display device according to an embodiment of the present disclosure taken along line AA' in FIG. 2, in which a flexible screen of the flexible display device is at a minimum extendable position. With reference to FIG. 1, FIG. 2 and FIG. 3, a flexible display device 100 according to an embodiment of the present disclosure includes a casing 10, a flexible screen 20, and a support member 30 disposed between the casing 10 and the flexible screen 20.

For convenience of description, a direction parallel to the line AA' in FIG. 2 is referred to as a lengthwise direction of the flexible screen 20, and a direction parallel to the line BB' in FIG. 2 is referred to as a widthwise direction of the flexible screen 20.

Optionally, the casing 10 may include a receiving portion 11 and a support base 12. As shown in FIG. 3, the receiving portion 11 is configured for receiving at least a part of the flexible screen 20. For example, the receiving portion 11 may have a receiving chamber 114 for receiving at least a part of the flexible screen 20 and at least a part of the support member 30. The support base 12 may be located below the flexible screen 20 and opposite to a part of the flexible screen 20 to support the flexible screen 20.

For example, the receiving portion 11 may be connected to the support base 12. Specifically, the receiving portion 11 and the support base 12 may be connected by welding, bonding, bolting, or the like. Alternatively, the receiving portion 11 and the support base 12 may be integrally formed, for example, by processing methods such as stamping, casting, injection molding, or the like.

Optionally, the flexible screen 20 is connected to and stacked onto the support member 30, and the support member 30 may include a rigid support portion 31 and a flexible support portion 32 which are arranged in the lengthwise direction of the flexible screen 20. For example, at least a part of the flexible screen 20 and at least a part of the flexible support portion 32 are rollable to be received in the receiving chamber 114.

In an example, the flexible screen 20 may fit slidably with the support base 12 by means of the support member 30. For example, the flexible screen 20 may be slidably disposed on the support base 12 through the support member 30, and the flexible screen 20 may move synchronously with the flexible support portion 32 to extend out of or retract into the receiving chamber 114 of the receiving portion 11 so as to adjust a length of a portion of the flexible screen 20 located above the support base 12, and the rigid support portion 31 below the portion of the flexible screen 20 supports the flexible screen 20 to provide a stable support for the flexible screen 20. In this way, the flexible screen 20 may be extended or retracted reliably and stably. The support member 30 provides a good supporting effect for the flexible screen 20, thereby reducing a risk that the flexible screen 20 may be damaged during extending and retracting processes, increasing a flatness of the extended flexible screen 20, and improving the display effect of the flexible screen 20.

The flexible screen 20 is used to display images and text. For example, the flexible screen 20 may be a flexible OLED display screen. The flexible screen 20 may be pulled to switch between a maximum extendable position and a minimum extendable position, and stay at any position between the maximum extendable position and the minimum extendable position. FIG. 3 shows that the flexible screen 20 is at the minimum extendable position, FIG. 4 shows that the flexible screen 20 is at the maximum extendable position, and FIG. 5 shows that the flexible screen 20 is at a certain position between the minimum extendable position and the maximum extendable position.

Figure 4:
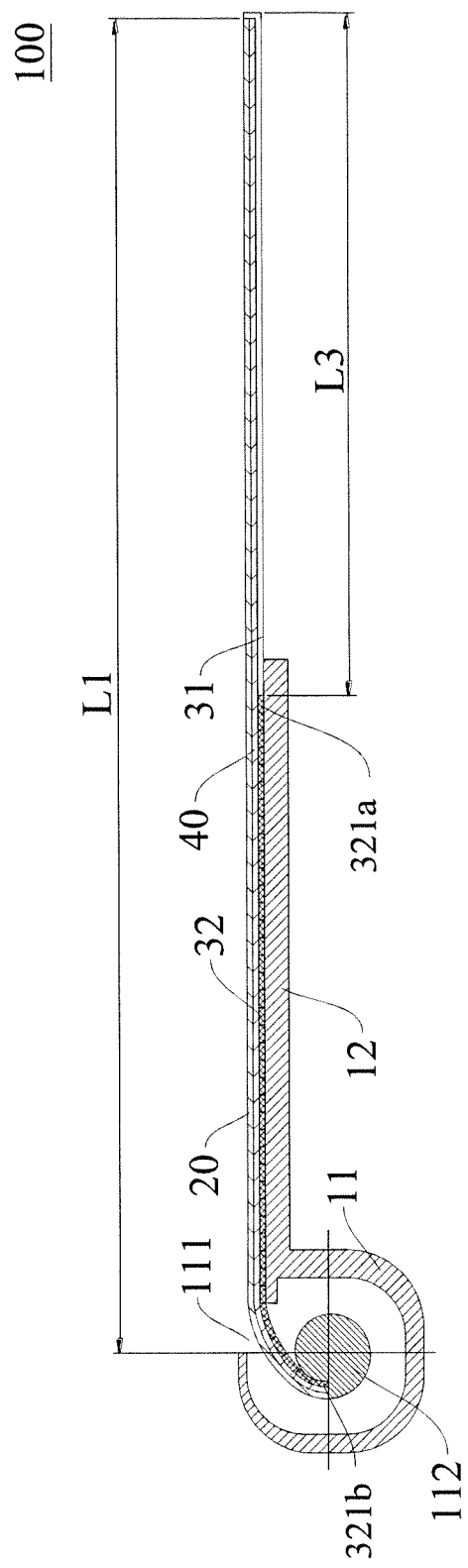
FIG. 4 is a cross-sectional view of the flexible display device according to an embodiment of the present disclosure taken along line AA' in FIG. 2, in which the flexible screen is at a maximum extendable position.
Figure 5:
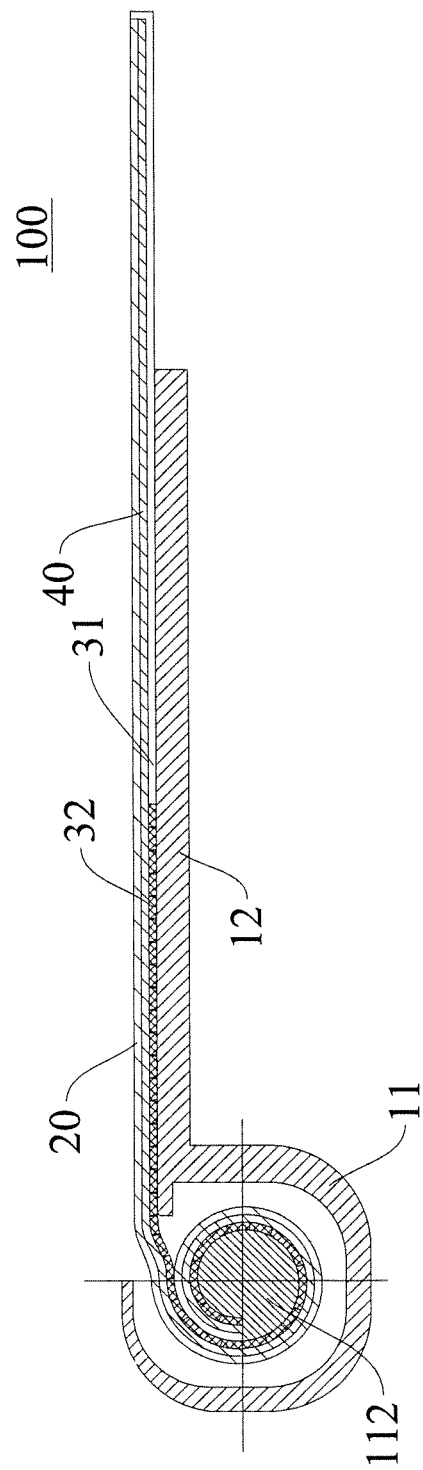
FIG. 5 is a cross-sectional view of the flexible display device according to an embodiment of the present disclosure taken along line AA' in FIG. 2, in which the flexible screen is at a position between the minimum extendable position and the maximum extendable position.

In other words, the flexible screen 20 may be switched between the maximum extendable position and the minimum extendable position according to user's requirements, so that the extended length of the flexible screen 20 is adjustable between a maximum extendable length L1 at the maximum extendable position (as shown in FIG. 4) and a minimum extendable length L2 at the minimum extendable position (as shown in FIG. 3). Further, the flexible screen 20 may be held at a suitable position between the maximum extendable position and the minimum extendable position so that the flexible screen 20 may stably stay at a suitable extended position after it is extended to the suitable position. In this way, the user may continuously obtain information on the flexible screen 20 and watch the flexible screen 20 for a long time.

As shown in FIGS. 1-5, the flexible screen 20 is connected to and stacked onto the support member 30. The support member 30 includes a rigid support portion 31 and a flexible support portion 32 which are arranged in the lengthwise direction of the flexible screen 20. The flexible screen 20 fits slidably with the support base 12 by means of the support member 30. For example, both the flexible screen 20 and the support member 30 may slide relative to the support base 12.

In the illustrated embodiment, a second portion of the flexible screen 20 and at least a part of the flexible support portion 32 may be rolled into the receiving chamber 114 of the receiving portion 11 while a first portion of the flexible screen 20 and the rigid support portion 31 extend out of the receiving portion 11. The rigid support portion 31 and the flexible support portion 32 are arranged in the lengthwise direction of the flexible screen 20, a first end of the flexible support portion 32 (i.e., an end of the flexible support portion 32 proximate to the receiving portion 11 when the flexible screen 20 is in an extended state) may extend into the receiving chamber 114 of the receiving portion 11, and a second end of the flexible support portion 32 (i.e., an end of the flexible support portion 32 distal to the receiving portion 11 when the flexible screen 20 is in the extended state) may be adjacent to the rigid support portions 31, so that the flexible support portion 32 may bring the flexible screen 20 to freely retract into or extend out of the receiving chamber 114 of the receiving portion 11. Optionally, the end of the flexible support portion 32 distal to the receiving portion 11 may be tightly connected to the rigid support portion 31, or there may be a certain distance between the end of the flexible support portion 32 distal to the receiving portion 11 and the rigid support portion 31.

It can be appreciated that, herein, "flexible screen" may mean that the entire screen is flexible, or that a part of the screen is flexible, for example, a part of the screen may be flexible and rollable and the other part of the screen is rigid and is always supported on a rigid support member. It will also be appreciated that, in an embodiment of the present disclosure, the flexible screen may include a flexible portion supported by the flexible support portion and a rigid portion supported by the rigid support portion, the flexible portion and the rigid portion of the flexible screen may be connected to each other, or the flexible portion and the rigid portion may be spaced apart by a certain distance, that is, in an embodiment of the present disclosure, it may include a flexible screen portion supported by the flexible support portion and a non-flexible screen portion supported by the rigid support portion.

Optionally, the support member 30 is located below and connected to the flexible screen 20. Specifically, the rigid support portion 31 is connected to the first portion of the flexible screen 20, and the flexible support portion 32 is connected to the second portion of the flexible screen 20. That is, as shown in FIG. 4, an orthographic projection of the rigid support portion 31 on the support base 12 at least partially overlaps with an orthographic projection of the flexible screen 20 on the support base 12, and more specifically, the orthographic projection of the rigid support portion 31 on the support base 12 overlaps with an orthographic projection of the first portion of the flexible screen 20 on the support base 12. An orthographic projection of the flexible support portion 32 on the support base 12 at least partially overlaps with the orthographic projection of the flexible screen 20 on the support base 12, and more specifically, the orthographic projection of the flexible support portion 32 on the support base 12 overlaps with an orthographic projection of the second portion of the flexible screen 20 on the support base 12. In this way, the first portion of the flexible screen 20 is always located outside the receiving portion 11 and supported by the rigid support portion 31, and the second portion of the flexible screen 20 together with the flexible support portion 32 may entirely or partially extend out of the receiving portion 11.

Optionally, during the process in which the flexible screen 20 is extended or retracted, the first portion of the flexible screen 20 may move correspondingly away from or towards the receiving portion 11. In other words, the rigid support portion 31 arranged in the lengthwise direction of the flexible screen 20 is located farther away from the receiving portion 11 than the flexible support portion 32.

It should be noted that the maximum extendable length L1 of the flexible screen 20 refers to the total length of the flexible screen 20 located outside the receiving chamber 114 of the receiving portion 11 when the flexible screen 20 is at the maximum extendable position, as shown in FIG. 4. The minimum extendable length L2 of the flexible screen 20 refers to the total length of the flexible screen 20 located outside the receiving chamber 114 of the receiving portion 11 when the flexible screen 20 is at the minimum extendable position, as shown in FIG. 3. The extended/retracted direction of the flexible screen 20 coincides with the lengthwise direction of the flexible screen 20, for example, the front-rear direction shown in FIG. 3.

In the embodiment shown in FIGS. 3 and 4, the rigid support portion 31 is at least partially supported on the support base 12 when the flexible screen 20 is at the maximum extendable position, and the rigid support portion 31 extends at least partially out of the support base 12 when the flexible screen 20 is at the minimum extendable position.

In this way, when the flexible support portion 32 brings the flexible screen 20 to extend out of the receiving portion 11, the rigid support portion 31 and the first portion of the flexible screen 20 connected to the rigid support portion 31 move away from the receiving portion 11, but the rigid support portion 31 is still at least partially located directly above and opposite to the support base 12, that is, supported by the support base 12. When the flexible support portion 32 brings the flexible screen 20 to retract into the receiving portion 11, the rigid support portion 31 and the first portion of the flexible screen 20 connected to the rigid support portion 31 move towards the receiving portion 11. Thus, during the flexible screen 20 is extended, the rigid support portion 31 is at least partially stably and reliably supported by the support base 12, thereby further improving the flatness of the flexible screen 20.

In the embodiment shown in FIG. 4, when the flexible screen 20 is at the maximum extendable position, the length of the portion of the rigid support portion 31 facing opposite to the support base 12 is 1/10 ~1/8 of the total length L3 of the rigid support portion 31. Thus, not only the flatness of the flexible screen 20 may be improved, but also the length of the rigid support portion 31 may be more reasonable, thereby increasing the structural stability of the flexible display device 100.

Optionally, the maximum extendable length L1 of the flexible screen 20 at the maximum extendable position is 1.5 to 2 times the minimum extendable length L2 of the flexible screen 20 at the minimum extendable position. Thus, the user may adjust the extended length of the flexible screen 20 according to the use requirements, so that the flexible screen 20 at the minimum extendable position has a good portability while the flexible screen 20 at the maximum extendable position has a good viewing experience.

Figure 6:
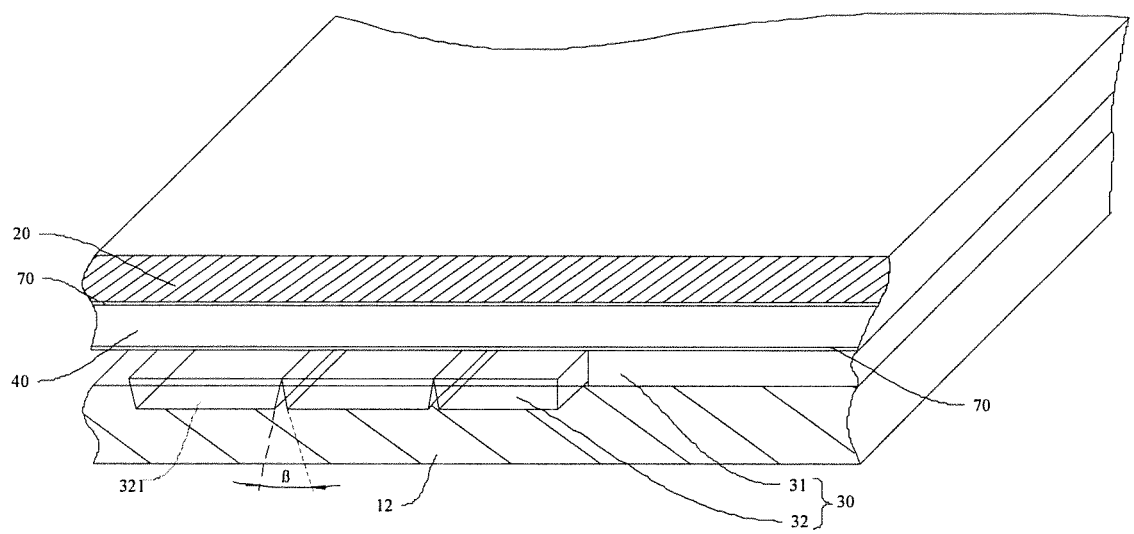
FIG. 6 is a partial cross-sectional view of the flexible display device according to an embodiment of the present disclosure taken along line AA' in FIG. 2.
Figure 7:
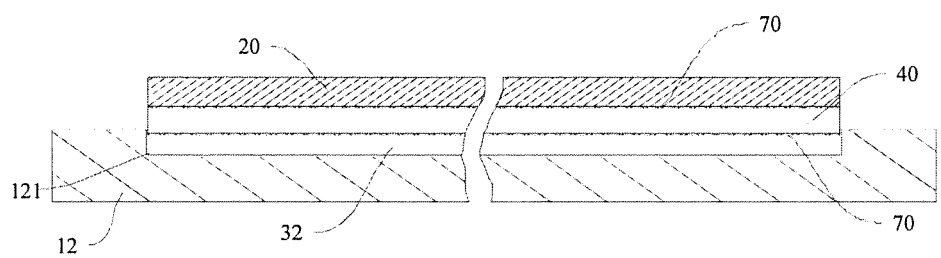
FIG. 7 is a partial cross-sectional view of the flexible display device according to an embodiment of the present disclosure taken along line BB' in FIG. 2.

As shown in FIG. 6 and FIG. 7, the flexible display device 100 may further include an elastic buffer layer 40 disposed between the flexible screen 20 and the support member 30. The support member 30 is connected to the flexible screen 20 through the elastic buffer layer 40. The flexible screen 20, the elastic buffer layer 40 and the support member 30 are stacked in this order from top to bottom.

For example, one side of the elastic buffer layer 40 is glued to the flexible screen 20, and the other side of the elastic buffer layer 40 is glued to the support member 30. The elastic buffer layer 40 may be formed by using a sponge or rubber having a certain buffer function. In this way, both a gap between the casing 10 and the flexible support portion 32 and a gap between the casing 10 and the rigid support portion 31 may be eliminated by the elastic buffer layer 40 so that the flatness of the flexible screen 20 may be further improved, also, vibration and impact onto the flexible display device 100 during operation may be absorbed by the elastic buffer layer 40 so that the service life of the flexible display device 100 may be increased.

Optionally, the elastic buffer layer 40 and the support member 30 may be connected by glue, and the elastic buffer layer 40 and the flexible screen 20 may be connected by glue. In other words, there is an adhesive layer 70 between the elastic buffer layer 40 and the support member 30 for bonding the elastic buffer layer 40 with the support member 30, and there is an adhesive layer 70 between the elastic buffer layer 40 and the flexible screen 20 for bonding the elastic buffer layer 40 and the flexible screen 20.

Figure 8:
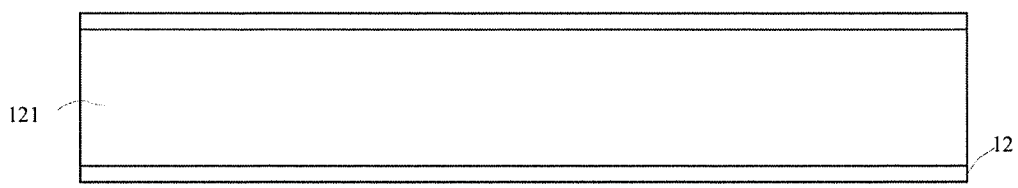
FIG. 8 is a plan view of a support base of a flexible display device according to an embodiment of the present disclosure, in which an accommodating slot formed in the support base is schematically shown.

As shown in FIG. 7, the support base 12 may have an accommodating slot 121. FIG. 8 shows a top view of the support base 12, which is not drawn to scale in order to highlight the accommodating slot. Referring to FIG. 7, FIG. 8 and FIGS. 3-5, a first end (one end proximate to the receiving portion 11) of the accommodating slot 121 communicates with an outlet 111 of the receiving portion 11, and a second end (one end distal to the receiving portion 11) of the accommodating slot 121 passes through the support base 12, as shown in FIG. 8. The flexible screen 20 is slidably engaged with the accommodating slot 121 at least by means of the flexible support portion 32 of the support member 30, as shown in FIG. 7. In this way, the flexible screen 20 is located above the support member 30, and the flexible support portion 32 is mounted in and engaged with the accommodating slot 121, so that the flexible support portion 32 may move in the accommodating slot 121 more smoothly to reduce the movement vibration of the flexible screen 20 relative to the casing 10, and the connection between the casing 10 and the flexible screen 20 may be more stable, more firm and more reliable.

Figure 9:
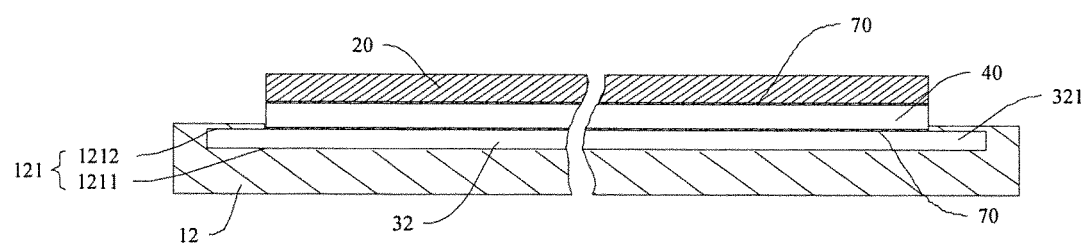
FIG. 9 is a partial cross-sectional view of the flexible display device according to another embodiment of the present disclosure taken along line BB' in FIG. 2.
Figure 10A:
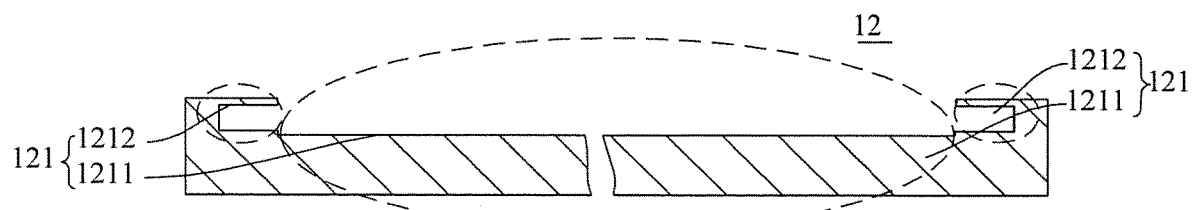
FIG. 10A is a cross-sectional view of a support base of a flexible display device according to another embodiment of the present disclosure.
Figure 10B:
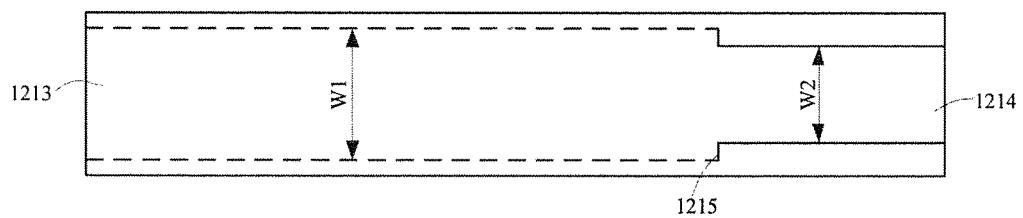
FIG. 10B is a plan view of a support base of a flexible display device according to another embodiment of the present disclosure, in which an accommodating slot formed in the support base is schematically shown.

Optionally, in an embodiment shown in FIG. 9, FIG. 10A and FIG. 10B, the accommodating slot 121 may include a main slot portion 1211 and concave portions 1212 located at sidewalls of the main slot portion 1211, and the flexible support portion 32 may include protrusions 321 which protrude from the flexible screen 20 and the rigid support portion 31 in the widthwise direction of the flexible screen 20. The protrusions 321 are fitted and slidably engaged with the concave portions 1212. In other words, the accommodating slot 121 may include a first slot portion 1213 and a second slot portion 1214, as shown in FIG. 10B. The first slot portion 1213 has a first width W1 in the widthwise direction of the flexible screen 20, the second slot portion 1214 has a second width W2 in the widthwise direction of the flexible screen 20, and the first width W1 is larger than the second width W2. A first end (one end proximate to the receiving portion 11) of the first slot portion 1213 communicates with the outlet 111 of the receiving portion 11. There is a step 1215 at a junction between a second end (one end distal to the receiving portion 11) of the first slot portion 1213 and a first end of the second slot portion 1214. A second end of the second slot portion 1214 passes through the support base 12.

For example, the rigid support portion 31 is flush with the flexible screen 20 in the widthwise direction of the flexible screen 20, that is, the width of the rigid support portion 31 in the widthwise direction of the flexible screen 20 is equal to the width of the flexible screen 20, which is equal to the second width W2 of the second slot portion 1214 in the widthwise direction of the flexible screen 20. The width of the flexible support portion 32 in the widthwise direction of the flexible screen 20 is equal to the first width W1 of the first slot portion 1213 in the widthwise direction of the flexible screen 20, that is, the flexible support portion 32 is protruded with respect to the rigid support portion 31 and the flexible screen 20 in the widthwise direction of the flexible screen 20. The flexible support portion 32 is slidably engaged with the first slot portion 1213. Thus, it ensures that the flexible screen 20 is extended and retracted smoothly, also the flexible screen 20 is located above the rigid support portion 31 to cover the rigid support portion 31 so that the flexible display device 100 has a high screen ratio.

In the embodiment, two ends of the flexible support portion 32 in the widthwise direction of the flexible screen 20 are inserted into the concave portions 1212 so that the flexible support portion 32 slides more stably and reliably in the accommodating slot 121. Further, when the flexible screen 20 is at the maximum extendable position, the flexible support portion 32 may be supported by the support base 12 to reduce the droop of peripheral portions of the flexible screen 20 and prevent intermediate portions of the flexible screen 20 from being ridged, thereby further improving the flatness of the flexible screen 20.

In the embodiment, the step 1215 is formed at the junction between the second end (the end distal to the receiving portion 11) of the first slot portion 1213 and the first end of the second slot portion 1214, so that the step 1215 may be configured to limit the flexible support portion 32 from further moving in the direction away from the receiving portion 11, that is, the step 1215 may become a stroke limit end.

Optionally, as shown in FIG. 7 and FIG. 9, at least a part of the elastic buffer layer 40 may protrude into the accommodating slot 121 to provide buffering and protection for the sliding of the flexible support portion 32 relative to the accommodating slot 121 so as to improve an operation environment of the flexible screen 20 and extend the service life of the flexible display device 100.

Referring to FIGS. 1 and 3-6 again, the flexible support portion 32 may include a plurality of pillow pieces 321 which are sequentially disposed in the lengthwise direction of the flexible screen 20, each of the pillow pieces 321 extending in the widthwise direction of the flexible screen 20.

As shown in FIG. 6, the flexible support portion 32 may include the plurality of pillow pieces 321 which are sequentially arranged in the lengthwise direction of the flexible screen 20. The plurality of pillow pieces 321 are located below the flexible screen 20 and adhered to the flexible screen 20 by means of the elastic buffer layer 40. Upper surfaces of the pillow pieces 321 are disposed opposite to the lower surface of the flexible screen 20. Optionally, the upper surfaces of the pillow pieces 321 may be densely arranged below the flexible screen 20, and the upper surfaces of two adjacent pillow pieces 321 are connected to each other. In this way, the plurality of pillow pieces 321 below the flexible screen 20 may provide a good support to the flexible screen 20 so as to improve the flatness of the flexible screen 20, and also the flexible support portion 32 may have a high structural strength, may be rolled for a plurality of times, and have a long service life.

Figure 11:
FIG. 11 is a schematic structural view of a flexible support portion of a support member of a flexible display device according to an embodiment of the present disclosure.

For example, the cross section of each of the pillow pieces 321 perpendicular to the widthwise direction the flexible screen 20 is in a shape of an inverted trapezoid, as shown in FIGS. 6 and 11. In this way, a part of the plurality of pillow pieces 321 having inverted trapezoidal cross sections extend out of the receiving portion 11, and the upper surfaces of the pillow pieces 321 extending out of the receiving portion 11 below the flexible screen 20 support the flexible screen 20, so that the flexible screen 20 has a high flatness. Also, two adjacent side faces of adjacent pillow pieces 321 in the receiving portion 11 are at least partially abutted against each other, as shown in FIG. 12, so that the flexible support portion 32 may be received in the receiving portion 11 easily and an occupation space of the flexible support portion 32 is small.

Figure 12:
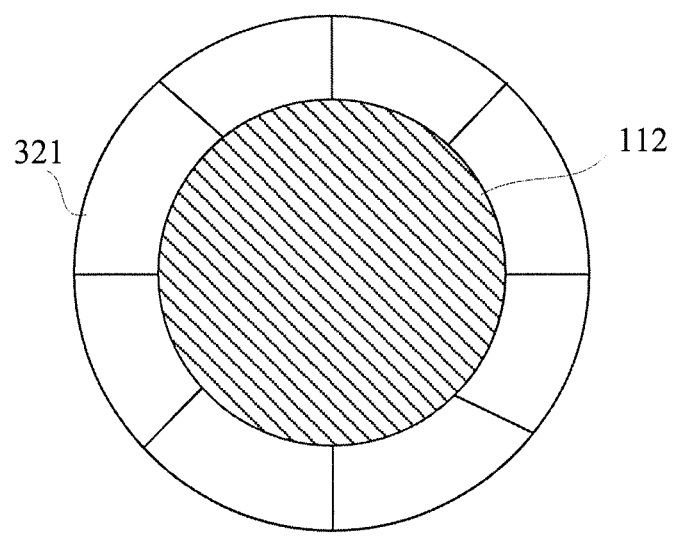
FIG. 12 is a schematic structural view of the flexible support portion in FIG. 11 when it is wound.

It can be understood that the cross section of each of the plurality of pillow pieces 321 perpendicular to the widthwise direction the flexible screen 20 is in the shape of inverted trapezoid such that a short side of the trapezoid is located at an inner side and a long side of the trapezoid is located at an outer side when the plurality of pillow pieces 321 are received in the receiving portion 11, in particular, wound on a reel 112, as shown in FIG. 12. In this way, it is possible to ensure that the plurality of pillow pieces 321 do not interfere with each other when they are wound.

As shown in FIG. 4 and FIG. 6, the pillow pieces 321 at two ends of the flexible support portion 32 may be referred to as a head pillow piece 321a and a tail pillow piece 321b, respectively. The tail pillow piece 321b is located at an end of the flexible support portion 32 proximate to the receiving portion 11, and located in the receiving chamber 114 of the receiving portion 11. The head pillow piece 321a is located at an end of the flexible support portion 32 distal to the receiving chamber 114. Optionally, angles 13 (see FIG. 6) between adjacent side faces of adjacent pillow pieces 321 are increased from the head pillow piece 321a towards the tail pillow piece 321b.

For example, the total amount n of the pillow pieces 321 depends on the width 1 of the pillow piece 321 (the size of each of the pillow pieces 321 in the lengthwise direction of the flexible screen 20, that is, the long side of the trapezoid) and a maximum movable distance L of the rigid support portion 31 or the flexible screen 20. The total amount n may be calculated as follows: n=(L+ΔL)/1, in which ΔL is the length of the flexible screen 20 that is stored in the receiving portion 11 when the flexible screen 20 is extended to the maximum extendable position.

The angle β between adjacent side faces of two adjacent pillow pieces depends on the amount of pillow pieces received in the receiving portion 11, and the angle β between adjacent side faces of two adjacent pillow pieces may be calculated as follows: β≤2π/2m, that is, β≤π/m, wherein β is the angle between adjacent side faces of two adjacent pillow pieces, π is a pi, and m is the amount of pillow pieces 321 in one loop in which the two adjacent pillow pieces are wound in the receiving portion 11.

As shown in FIG. 3, it should be understood that the amount of the pillow pieces 321 in one inner loop wound on the reel 112 of the receiving portion 11 is smaller than the amount of the pillow pieces 321 in one outer loop wound on the reel 112 of the receiving portion 11. Therefore, the angles 13 between adjacent side faces of two adjacent pillow pieces are different. Specifically, the angles 13 between adjacent side faces of two adjacent pillow pieces (see FIG. 6) are increased from the head pillow piece 321a towards the tail pillow piece 321b.

In this way, the plurality of pillow pieces 321 wound on the reel 112 of the receiving portion 11 are more closely abutted against each other, and the plurality of pillow pieces 321 do not cause the flexible screen 20 to be ridged during they are wound. And the lengths of the plurality of pillow pieces 321 are in a reasonable proportional relationship with the length of the support member 30, so that the flexible screen 20 may extend from and retract into the receiving portion 11 more stably and more reliably.

It can be understood that a certain angle β is formed between adjacent side faces of any two adjacent pillow pieces 321, so that the adjacent faces of any two adjacent pillow pieces 321 may be abutted against each other when the plurality of pillow pieces 321 are wound in the receiving chamber 114 so as to reduce the occupation space of the wound pillow pieces.

In some embodiments, a material of the flexible support portion 32 may include any one or a combination of metal, rigid plastic and hard composite. Thus, the flexible support portion 32 has a certain strength so that the flexible display device 100 has a high structural strength, a low material cost and a light weight.

Figure 13:
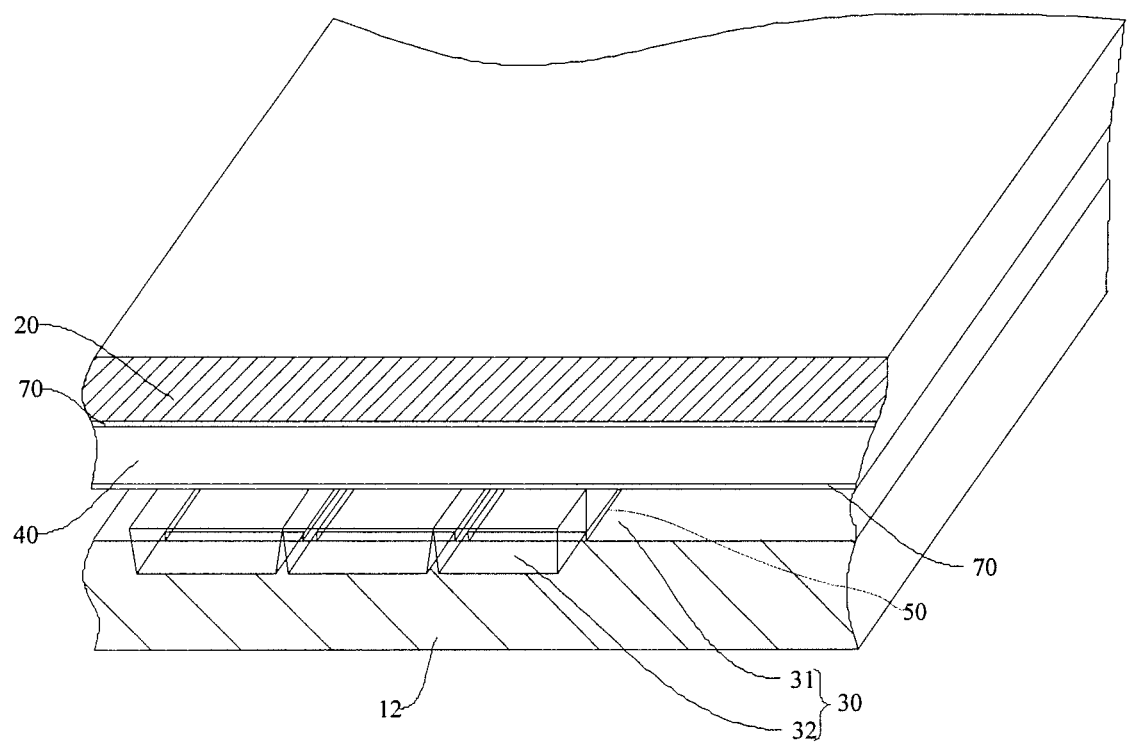
FIG. 13 is a partial cross-sectional view of a flexible display device according to another embodiment of the present disclosure taken along line AA' in FIG. 2.
Figure 14:
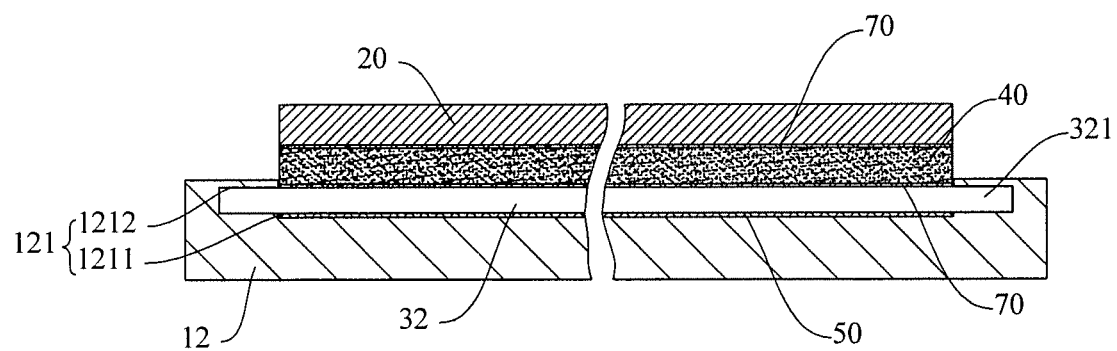
FIG. 14 is a partial cross-sectional view of the flexible display device according to another embodiment of the present disclosure taken along line BB' in FIG. 2.

As shown in FIGS. 13 and 14, the flexible display device 100 may further include a protective layer 50 disposed between the support member 30 and the casing 12. Optionally, the protective layer 50 is located below and connected to the support member 30, and the protective layer 50 is connected to at least the bottom of the flexible support portion 32. By means of the protective layer 50, a connection stability between the flexible support portion 32 and the receiving portion 11 may be improved, also the structural stability of the flexible display device 100 may be further improved.

In an example, one side of the protective layer 50 facing towards the support member 30 may be adhesive, and the other side of the protective layer 50 facing away from the support member 30 may be elastic. For example, one side of the protective layer 50 facing away from the support member 30 may include a material such as foam. The protective layer 50 may extend from or retract into the receiving chamber 114 along with the flexible support portion 32. When the protective layer 50 is wound on the reel 112, the protective layer 50 is located between the support member 30 and the flexible screen 20 to prevent the flexible screen 20 from being scratched.

Figure 15:
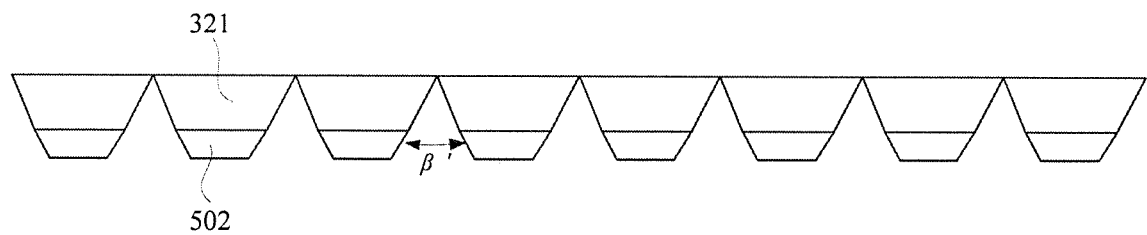
FIG. 15 is a schematic structural view of a flexible support portion of a support member of a flexible display device according to another embodiment of the present disclosure.

Optionally, as shown in FIGS. 13-15, the protective layer 50 may include a plurality of protective blocks 502 that are sequentially arranged in the lengthwise direction of the flexible screen 20. The plurality of protective blocks 502 are in one-to-one correspondence with the plurality of pillow pieces 321. For example, the amount of the protective blocks 502 is the same as the amount of the pillow pieces 321, and a structure of each of the protective blocks 502 is similar to that of the corresponding pillow piece 321.

For example, the cross section of each of the protective blocks 502 perpendicular to the widthwise direction of the flexible screen 20 is in a shape of an inverted trapezoid, as shown in FIG. 15. Thus, adjacent side faces of two adjacent protective blocks 502 in the receiving chamber 114 are at least partially abutted against each other, as shown in FIG. 16, so that the protective layer 50 may be received in the receiving chamber 114 easily and have a small occupation space.

Figure 16:
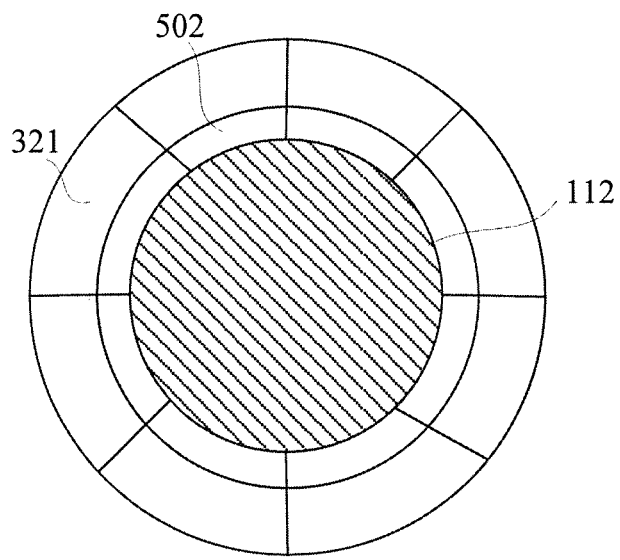
FIG. 16 is a schematic structural view of the flexible support portion in FIG. 15 when it is wound.

It can be understood that the cross section of each of the protective blocks 502 perpendicular to the widthwise direction the flexible screen 20 is in the shape of inverted trapezoid such that a short side of the trapezoid is located at an inner side and a long side of the trapezoid is located at an outer side when the protective blocks 502 are received in the receiving chamber 114, in particular, wound on the reel 112, as shown in FIG. 16. In this way, it is possible to ensure that the protective blocks 502 do not interfere with each other when they are wound.

Similar to the pillow pieces 321, the protective blocks 502 at two ends of the protective layer 50 may be referred to as a head protective block and a tail protective block, respectively. The tail protective block 502 is located at an end of the protective layer 50 proximate to the receiving chamber 114, and located in the receiving chamber 114 of the receiving portion 11. The head protective block 502 is located at an end of the protective layer 50 distal to the receiving chamber 114. Optionally, angles 13' (see FIG. 15) between adjacent side faces of adjacent protective blocks 502 are increased from the head protective block towards the tail protective block.

Figure 17:
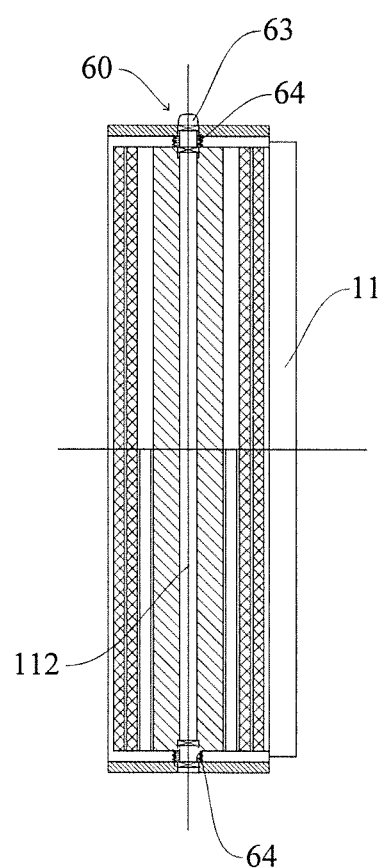
FIG. 17 is a cross-sectional view showing a mating relationship of a flexible screen, a support member, an elastic buffer layer, a reel, and a locking member of a flexible display device according to an embodiment of the present disclosure.

As shown in FIG. 17, the flexible display device 100 may further include a locking member 60. The receiving portion 11 is provided with a reel 112. At least one of the flexible screen 20 and the support member 30 is connected to the reel 112. The locking member 60 is configured to limit a rotation of the reel 112 so as to lock the flexible screen 20 in position, that is, the locking member 60 may be operated to limit rotation of the reel 112 to position the flexible screen 20.

For example, the reel 112 is disposed in the receiving portion 11, and the tail pillow piece 321*b* of the flexible support portion is fixedly connected to the reel 112, so that the flexible support portion 32 may be retracted or extended in synchronization with the flexible screen 20 under driven of the reel 112.

Optionally, the locking member 60 may be configured to control the movement of the flexible screen 20 in the extending direction, and may be adapted to lock the flexible screen 20 when the extending movement of the flexible screen 20 is stopped, so that the flexible screen 20 may be held at any position between the maximum extendable position and the minimum extendable position.

Figure 18:
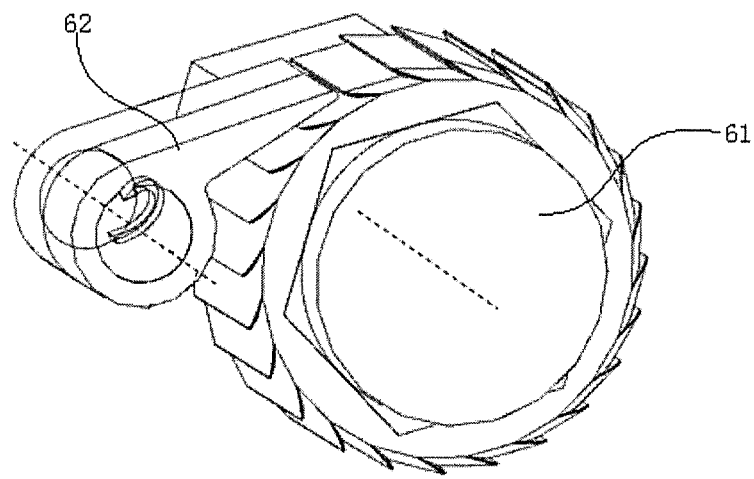
FIG. 18 is a perspective view of a ratchet and a pawl of a flexible display device according to an embodiment of the present disclosure.
Figure 19:
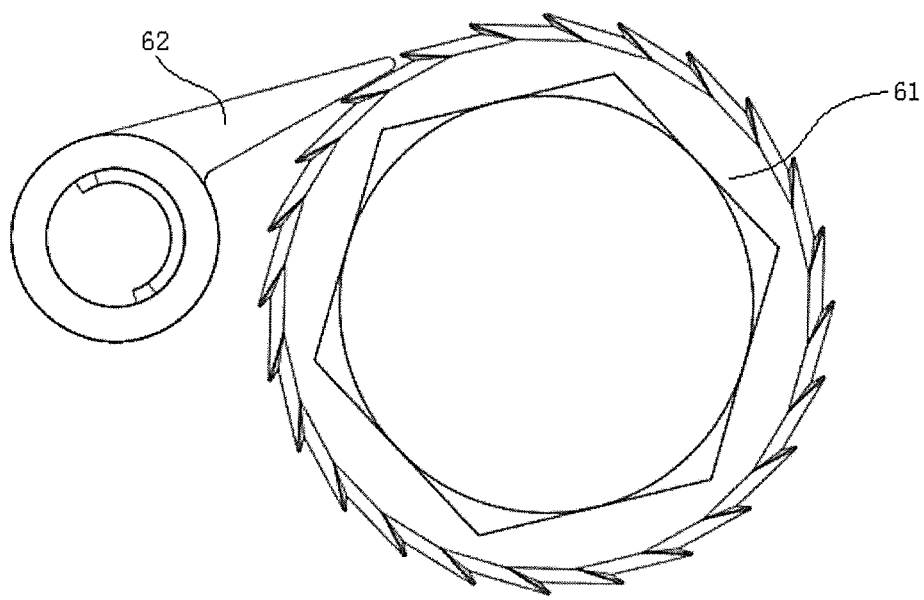
FIG. 19 is a schematic view of a ratchet and a pawl of a flexible display device according to an embodiment of the present disclosure.

In the embodiment shown in FIGS. 18 and 19, the locking member 60 includes a ratchet mechanism including a ratchet 61 and a pawl 62. The ratchet 61 is coaxially coupled with the reel 112. The pawl 62 engages with the ratchet 61 to prevent the ratchet 61 from rotating in one direction so as to prevent the flexible screen 20 from being retracted.

Thus, by means of the engagement of the ratchet 61 and the pawl 62, the locking member 60 may lock the flexible screen 20 in position. In this way, the locking member 60 may be operated reliably. Also, the ratchet mechanism has a simple structure, and is easy to be manufactured and assembled.

As shown in FIGS. 17, 18 and 19, the locking member 60 further includes an unlocking switch 63 and an elastic return member 64. The unlocking switch 63 is connected to the pawl 62 to trigger the pawl 62 to disengage from the ratchet 61. The elastic return member 64 drives the ratchet 61 to rotate in one direction so as to retract the flexible screen 20. Specifically, the lock member 60 is disposed on the reel 112, and the unlocking switch 63 extends out of the reel 112 to facilitate user's operation. Thereby, the adjustment of the flexible screen 20 is simple and convenient.

Of course, in the embodiments of the present disclosure, the structure for driving the flexible screen 20 to extend and retract is not limited thereto, and the flexible screen 20 or the flexible support portion 32 may be driven by the microrotary motor to drive the flexible screen 20 to extend out of and retract into the receiving portion 11.

Specifically, the operation of the locking member 60 having the ratchet mechanism may be described as follows.

Firstly, when the flexible screen 20 is extended, the reel 112 drives the ratchet 61 to rotate clockwise. Next, when the extending movement of the flexible screen 20 is stopped, the pawl 62 abuts against the ratchet 61 to prevent the ratchet 61 from rotating counterclockwise so as to prevent the flexible screen 20 from being retracted under driven of the elastic return member 64. Then, when it is required to retract the flexible screen 20 to the minimum extendable position, the unlocking switch 63 is pressed to disengage the ratchet 61 from the pawl 62 so as to retract the flexible screen 20 to the minimum extendable position under driven of the elastic return member 64.

In the descriptions of the present disclosure, it is to be understood that the terms indicating orientations or positional relationships, such as "center", "longitudinal", "transverse", "lengthwise", "widthwise", "thickness", "upper", "lower", "front", "rear", "left", "right", "vertical", "horizontal", "top", "bottom", "inside", "outside" and the like, are based on orientations or positional relationships shown in the accompanying drawings, they are merely for the purpose of facilitating the descriptions of the present disclosure and the simplification of the present disclosure, and are not intended to limiting the present disclosure.

Moreover, the terms such as "first" and "second" are merely used for descriptive purposes, and are not to be construed as indicating or implying a relative importance or implicitly indicating the amount of technical features indicated. Thus, features defined by the terms such as "first" and "second" may include one or more of the features either explicitly or implicitly. In the descriptions of the present disclosure, the meaning of "a plurality of" may include at least two, such as two, three, etc., unless specifically defined otherwise.

In the present disclosure, unless explicitly stated or defined otherwise, the terms such as "mount", "connect", "connected", "fixed" and the like, are to be understood broadly, and may include a fixed connection, a detachable connection or integrally formed; may be a mechanical connection, an electrical connection or may communicate with each other; may be directly connected or indirectly connected through an intermediate medium; may be an internal communication of two elements or an interaction of two elements. For those skilled in the art, the specific meanings of the above terms in the present disclosure may be understood according to specific cases.

In the present disclosure, unless otherwise specifically stated or defined, the limitation that the first feature is "above" or "below" the second feature may include that the first feature is in direct contact with the second feature, or that the first feature is not in direct contact with the second feature but in contact with the second feature through additional features between them. Moreover, the limitation that the first feature is "on" or "above" the second feature may include that the first feature is directly above or obliquely above the second feature, or merely indicate that the first feature is placed at a level higher than the second feature. The limitation that the first feature is "below" the second feature may include that the first feature is directly below or obliquely below the second feature, or merely indicate that the first feature is placed at a level lower than the second feature.

In the descriptions of the present specification, the terms such as "an embodiment", "some embodiments", "example", "specific example", or "some examples" and the like mean that specific features, structures, materials or characteristics described in connection with the embodiment or example may be included in at least one embodiment or example of the present disclosure. In the present specification, the schematic representation of the above terms is not necessarily directed to the same embodiment or example. Furthermore, the specific features, structures, materials or characteristics described may be combined in a suitable manner in any one or more embodiments or examples. Further, various embodiments or examples described in the specification can be joined and combined by those skilled in the art.

While the embodiments of the present disclosure have been shown and described above, it is understood that the above-described embodiments are illustrative and are not to be construed as limiting the scope of the disclosure. The above-described embodiments may be varied, modified, changed and substituted in the scope of the disclosure by those skilled in the art.

What is claimed is:

1. A flexible display device comprising:
   a flexible screen;
   a casing comprising a receiving portion and a support base; and
   a support member between the flexible screen and the casing, the support member comprising a rigid support portion and a flexible support portion which are arranged in a lengthwise direction of the flexible screen,
   wherein the receiving portion comprises a receiving chamber configured for receiving at least a part of the flexible screen and at least a part of the flexible support portion, and the flexible screen fits slidably with the support base by means of the support member;
   wherein the flexible support portion comprises a plurality of pillow pieces arranged in the lengthwise direction of the flexible screen, each of the plurality of pillow pieces extending in a widthwise direction of the flexible screen;
   wherein a cross section of each of the plurality of pillow pieces perpendicular to the widthwise direction of the flexible screen is in a shape of an inverted trapezoid;
   wherein the plurality of pillow pieces of the flexible support portion comprise a tail pillow piece and a head pillow piece, the tail pillow piece being located at an end of the flexible support portion proximal to the receiving chamber, the head pillow piece being located at an end of the flexible support portion distal to the receiving chamber; and
   wherein angles between adjacent side faces of the plurality of pillow pieces are increased from the head pillow piece towards the tail pillow piece.

2. The flexible display device of claim 1, wherein an orthographic projection of the rigid support portion on the support base at least partially overlaps with an orthographic projection of the flexible screen on the support base.

3. The flexible display device of claim 1, further comprising an elastic buffer layer between the flexible screen and the support member.

4. The flexible display device of claim 1, wherein the support base comprises an accommodating slot, a first end of the accommodating slot communicates with an outlet of the receiving chamber, and the accommodating slot passes through the support base; and
   wherein the flexible screen fits slidably with the accommodating slot at least by means of the flexible support portion.

5. The flexible display device of claim 4, wherein the accommodating slot comprises a first slot portion and a second slot portion, the first slot portion having a first width in a widthwise direction of the flexible screen, the second slot portion having a second width in the widthwise direction of the flexible screen, the first width being larger than the second width;
   wherein the flexible support portion comprises protrusions that protrude from the flexible screen and the rigid support portion in the widthwise direction of the flexible screen; and
   wherein the flexible support portion fits slidably with the first slot portion.

6. The flexible display device of claim 5, wherein a first end of the first slot portion communicates with the outlet of the receiving chamber;
   a step is formed at a junction between a second end of the first slot portion and a first end of the second slot portion; and
   a second end of the second slot portion passes through the support base.

7. The flexible display device of claim 6, wherein a width of the rigid support portion in the widthwise direction of the flexible screen is smaller than a width of the flexible support portion in the widthwise direction of the flexible screen.

8. The flexible display device of claim 1, further comprising a protective layer between the support member and the casing, the protective layer being connected to at least a bottom of the flexible support portion.

9. The flexible display device of claim 1, further comprising a protective layer between the support member and the casing, the protective layer being connected to at least a bottom of the flexible support portion.

10. The flexible display device of claim 9, wherein the protective layer comprises a plurality of protective blocks arranged in the lengthwise direction of the flexible screen, each of the plurality of protective blocks extending in the widthwise direction of the flexible screen extend.

11. The flexible display device of claim 10, wherein a cross section of each of the plurality of protective blocks perpendicular to the widthwise direction of the flexible screen is in a shape of an inverted trapezoid.

12. The flexible display device of claim 1, wherein a material of the flexible support portion comprises any one or a combination of metal, rigid plastic and hard composite.

13. The flexible display device of claim 9, wherein one side of the protective layer facing towards the support member is adhesive, and the other side of the protective layer facing away from the support member is elastic.

14. The flexible display device of claim 10, wherein an amount of the plurality of pillow pieces is the same as the amount of the plurality of protective blocks.

15. The flexible display device of claim 1, further comprising:
a reel in the receiving chamber, at least one of the flexible screen and the support member being connected to the reel; and
a locking member configured to limit rotation of the reel so as to position the flexible screen.

16. The flexible display device of claim 15, wherein the locking member comprises a ratchet mechanism comprising a ratchet and a pawl, the ratchet being coaxially connected to the reel, and the pawl engaging with the ratchet.

17. The flexible display device of claim 16, wherein the locking member further comprises an unlocking switch and an elastic return member, the unlocking switch being connected to the pawl to trigger the pawl to disengage from the ratchet, the elastic return member being configured to drive the ratchet to rotate in one direction so as to retract the flexible screen into the receiving chamber.

18. A flexible display device comprising:
a flexible screen;
a casing comprising a receiving portion and a support base; and
a support member between the flexible screen and the casing, the support member comprising a rigid support portion and a flexible support portion which are arranged in a lengthwise direction of the flexible screen,
wherein the receiving portion comprises a receiving chamber configured for receiving at least a part of the flexible screen and at least a part of the flexible support portion, and the flexible screen fits slidably with the support base by means of the support member;
wherein the support base comprises an accommodating slot comprising a first slot portion and a second slot portion, the first slot portion having a first width in a widthwise direction of the flexible screen, the second slot portion having a second width in the widthwise direction of the flexible screen, the first width being larger than the second width;
wherein the flexible support portion comprises protrusions that protrude from the flexible screen and the rigid support portion in the widthwise direction of the flexible screen; and
wherein the flexible support portion fits slidably with the first slot portion.

19. A flexible display device comprising:
a flexible screen;
a casing comprising a receiving portion and a support base; and
a support member between the flexible screen and the casing, the support member comprising a rigid support portion and a flexible support portion which are arranged in a lengthwise direction of the flexible screen,
wherein the receiving portion comprises a receiving chamber configured for receiving at least a part of the flexible screen and at least a part of the flexible support portion, and the flexible screen fits slidably with the support base by means of the support member;
wherein the flexible support portion comprises a plurality of pillow pieces arranged in the lengthwise direction of the flexible screen, each of the plurality of pillow pieces extending in a widthwise direction of the flexible screen;
wherein the plurality of pillow pieces of the flexible support portion comprise a tail pillow piece and a head pillow piece, the tail pillow piece being located at an end of the flexible support portion proximal to the receiving chamber, the head pillow piece being located at an end of the flexible support portion distal to the receiving chamber; and
wherein angles between adjacent side faces of the plurality of pillow pieces are increased from the head pillow piece towards the tail pillow piece.

* * * * *